United States Patent [19]

Holce et al.

[11] 4,220,834
[45] Sep. 2, 1980

[54] TELEPHONE LINE ATTENUATOR NETWORK AND ATTENUATOR PAD THEREFOR

[75] Inventors: Thomas J. Holce, Portland; Charles M. Huckins, Tigard, both of Oreg.

[73] Assignee: Kentrox Industries, Inc., Portland, Oreg.

[21] Appl. No.: 739,980

[22] Filed: Nov. 8, 1976

Related U.S. Application Data

[63] Continuation of Ser. No. 534,630, Dec. 19, 1974, abandoned, which is a continuation of Ser. No. 262,714, Jun. 14, 1972, abandoned.

[51] Int. Cl.² .................... H04M 1/76; H05K 7/02
[52] U.S. Cl. ........................ 179/190; 179/1 PC; 179/98; 338/221; 338/320; 361/409
[58] Field of Search ............ 179/190, 98, 91 R, 16 F, 179/170 R, 107 R, 1 D, 1 PC; 317/101 C, 101 B, 101 CC, 101 CE, 101 CH; 323/74, 79, 80; 333/81 A, 81 R; 338/220, 221, 320

[56] References Cited

U.S. PATENT DOCUMENTS

| 3,130,351 | 4/1964 | Giel | 317/101 DH |
| 3,177,406 | 4/1965 | Bernstein | 317/101 CC |
| 3,462,558 | 8/1969 | Selz | 179/98 |

OTHER PUBLICATIONS

"Potted Electronic Circuits", *Radio & Television News*, Dec. 1950, p. 6A et seq.

*Primary Examiner*—Thomas W. Brown
*Attorney, Agent, or Firm*—Chernoff & Vilhauer

[57] ABSTRACT

A telephone line attenuator pad comprises a printed circuit board one portion of which mounts a plurality of resistances each connected in series with a pair of electrical printed circuit conductors. The resistances and mounting portion of the board are potted within a hollow case and the remaining portion of the board, including portions of the printed circuit conductors, projects from the case for removable mounting, in either of two opposing orientations, in an electrical connector to which are connected a plurality of permanent, fixed resistors included in the attenuator network to which telephone line circuitry is connected.

2 Claims, 9 Drawing Figures

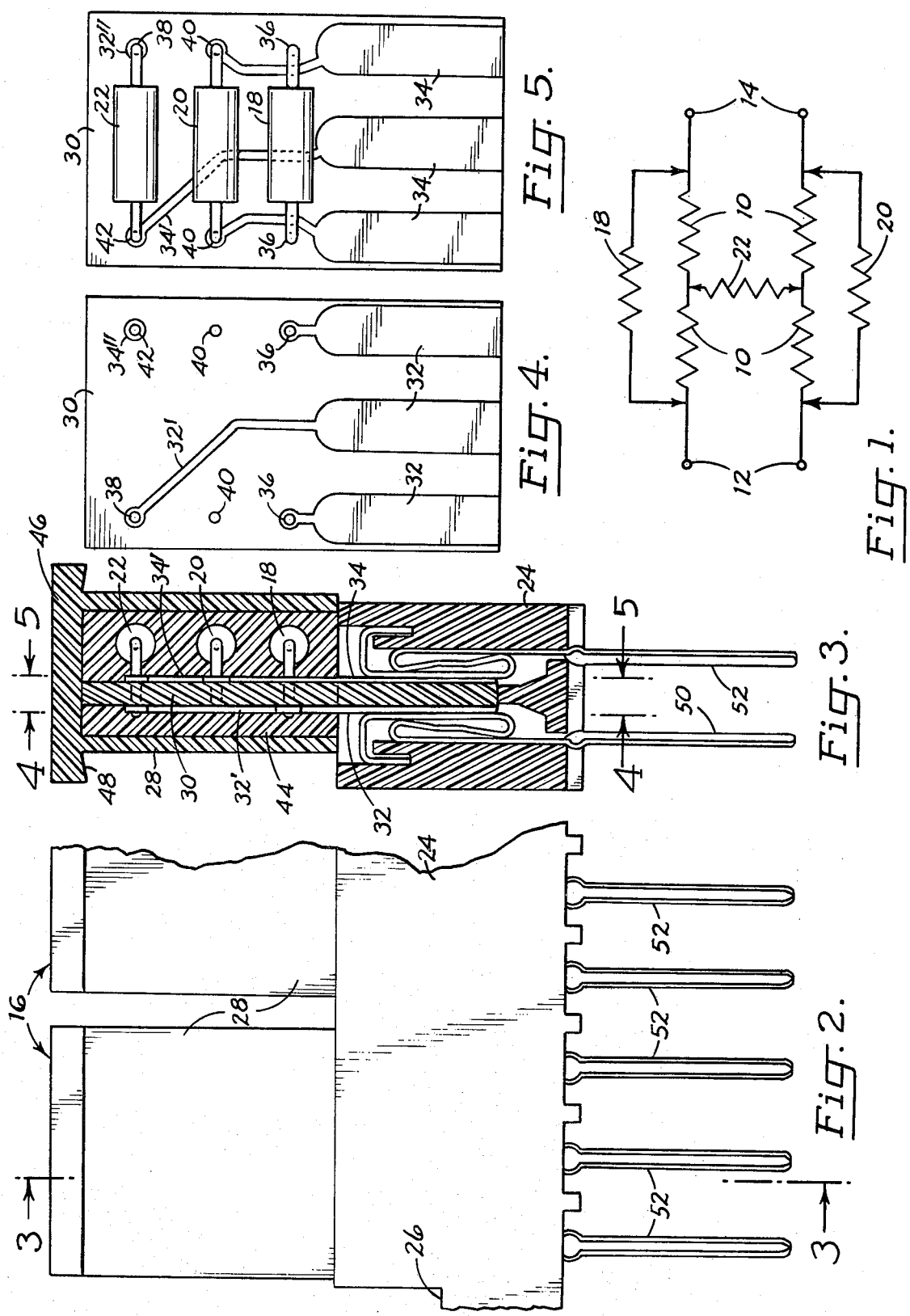

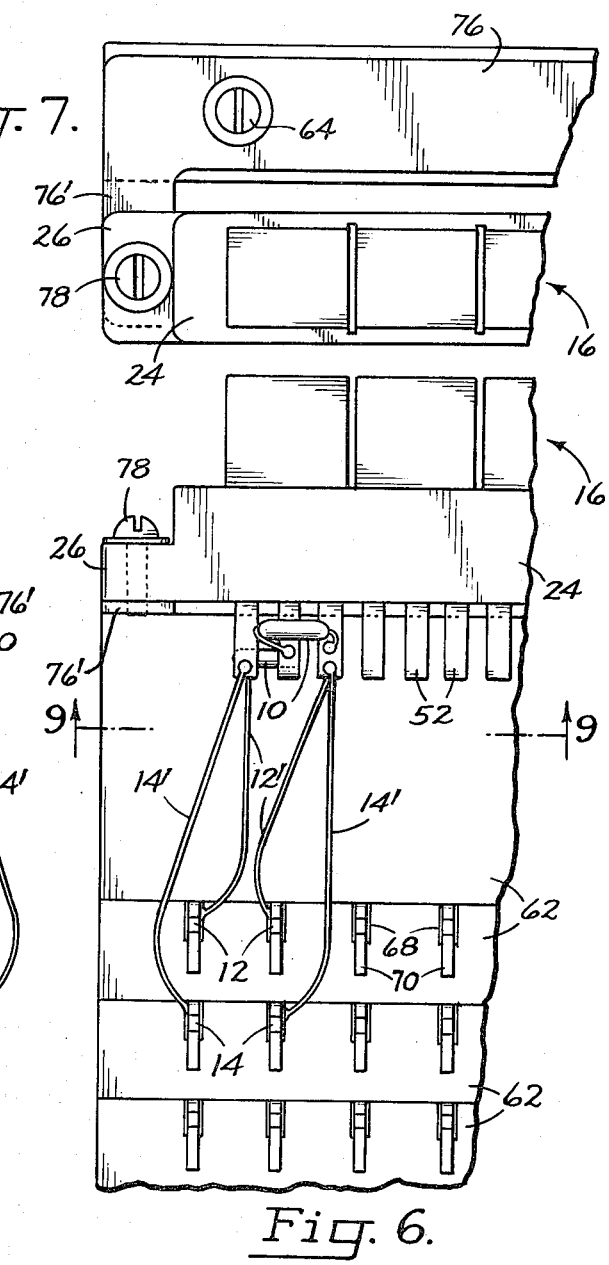
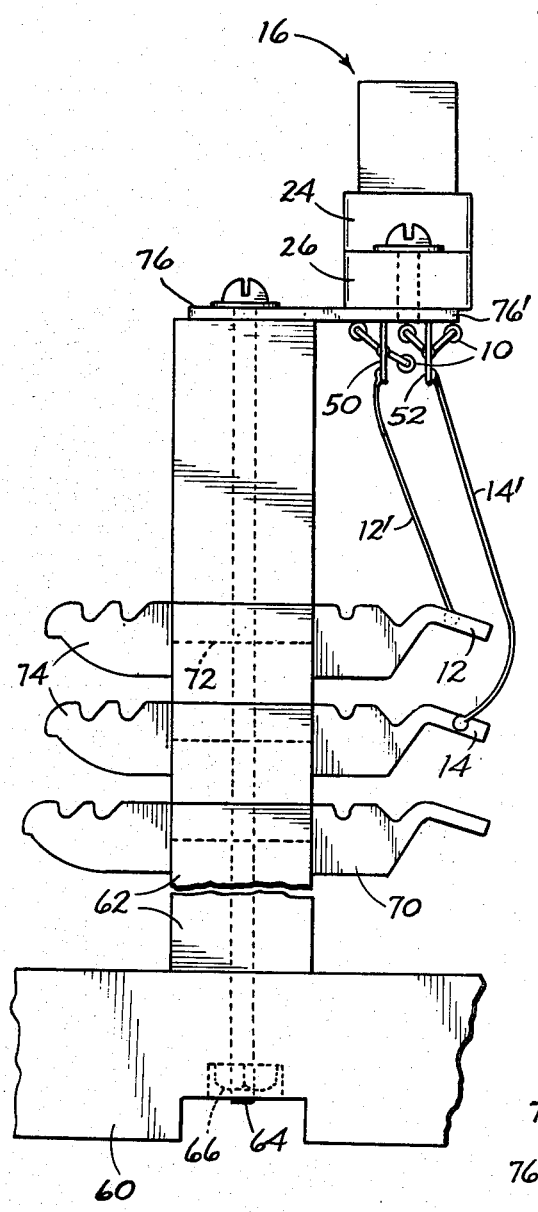
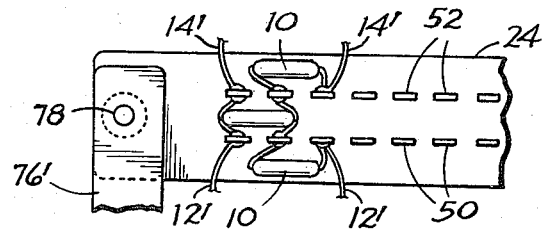

TELEPHONE LINE ATTENUATOR NETWORK AND ATTENUATOR PAD THEREFOR

REFERENCE TO RELATED APPLICATIONS

This is a continuation of our pending application Ser. No. 534,630, filed Dec. 19, 1974, which is in turn a continuation of our then pending original application Ser. No. 262,714, filed June 14, 1972, both of which are now abandoned.

BACKGROUND OF THE INVENTION

This invention relates to telephone circuitry, and more particularly to a novel attenuator network assembly and attenuator pad therefor.

Attenuator networks are required in telephone circuitry, one for each telephone line, to modify the power level of electric input signals transmitted from a calling telephone to a predetermined magnitude for proper amplification before sending them on to a receiving telephone. Each telephone line may require different attenuation and therefore the central office is required to inventory a large number of attenuator pads of various magnitudes of resistance.

Attenuator pads utilized heretofore in the telephone industry are of costly construction and are relatively large in size. Because of their size they are contained in large equipment bays which utilize a substantial amount of expensive floor space in telephone central offices. Moreover, this arrangement requires extensive wiring to and from a main frame, and such wiring represents a further cost factor both as to materials and as to labor of installation and maintenance. Inventory supplies of such large size attenuator pads also require substantial expensive storage space in the central office.

SUMMARY OF THE INVENTION

In its basic concept, this invention provides an attenuator network assembly and attenuator pad of miniature size, by the mounting of electrical resistance components on a substrate in series connection with electric conductors deposited on the substrate, arranged for removable connection to permanent, fixed resistors on a miniature connector and forming a part of an attenuator network for connection to telephone line circuitry.

It is by virtue of the foregoing basic concept that the principal objective of this invention is achieved; namely, to overcome the aforementioned disadvantages of prior attenuator network assemblies and pads.

Another important object of this invention is the provision of an attenuator pad of the class described which reduces the space requirement in telephone central offices by a factor of about fifteen, as compared with conventional attenuator pads.

A further important object of this invention is the provision of an attenuator network assembly and pad of the class described which may be mounted on the main frame of telephone central equipment, thereby eliminating the necessity of equipment bays and the multiplicity of wirings to and from them.

The foregoing and other objects and advantages of this invention will appear from the following detailed description, taken in connection with the accompanying drawings of a preferred embodiment.

BRIEF DESCRIPTION OF THE DRAWINGS

FIG. 1 is a schematic diagram of the electric circuit of a typical attenuator network for telephone lines.

FIG. 2 is a fragmentary view in side elevation, on a substantially enlarged scale, of an assembly of an electrical connector and a plurality of attenuator pads embodying the feature of this invention.

FIG. 3 is a sectional view taken along the line 3—3 in FIG. 2 showing details of construction of the assembly.

FIGS. 4 and 5 are views in side elevation of opposite sides of a printed circuit board and resistance assembly as viewed in the directions of the arrows 4—4 and 5—5, respectively, in FIG. 3.

FIG. 6 is a fragmentary front elevation of an attenuator network assembly embodying the features of this invention.

FIG. 7 is a fragmentary plan view as viewed from the top in FIG. 6.

FIG. 8 is a foreshortened, fragmentary side elevation as viewed from the left in FIG. 6.

FIG. 9 is a fragmentary bottom view as viewed in the direction of arrows 9—9 in FIG. 6.

DESCRIPTION OF THE PREFERRED EMBODIMENT

Referring first to FIG. 1 of the drawing, the schematic circuit diagram illustrates a typical attenuator network of the bridged H type. Thus, it includes two legs of permanent, fixed resistors 10, usually of 300 ohms each. Each leg includes two such resistors connected together in series. The legs of the pad are shown with input terminals 12 and output terminals 14 for connection to telephone line circuitry, as will be understood.

As mentioned previously, attenuator networks are required to be provided in a wide range of resistance values. Accordingly it is a conventional practice to associate with the permanent, fixed resistors 10, a plug-in component, commonly referred to as an attenuator pad 16 (FIG. 2 and 3), which includes series and shunt resistors of various values which, when combined with the permanent resistors, provides the desired attenuation values. Thus, in FIG. 1 the attenuator pad includes the series resistors 18 and 20, one associated with each leg and each arranged for connection in parallel across one of the two permanent resistors 10 of the leg. The attenuator pad also includes a shunt resistor 22 arranged for connection across the legs between the pairs of permanent resistors.

The resistance values of the series and shunt resistors are selected for association with the permanent resistors to provide the desired magnitude of attenuation, as previously mentioned. Thus, for example, if the attenuator network includes 300 ohm permanent resistors and it is desired that the attenuation be 3.0 db, the series resistors 18 and 20 are chosen to have a resistance of 128.8 ohms each and the shunt resistor 22 is chosen to have a resistance value of 1,454 ohms. As will be understood, various other values for the series and shunt resistors are selected to provide an attenuation range of, for example, from 0–35 db in 0.2 db increments.

A typical attenuator pad, commonly identified as an eighty-nine type resistor, is contained in a cylindrical metal housing measuring about 1⅜ inch in diameter and about 1¾ inches long and provided at one end with a multiple prong male socket base, of the familiar vacuum tube base type, for removable reception in a correspondingly apertured female socket. Two of the male prongs are enlarged in diameter to properly orient the multiple male prongs for correct circuit connections. In this regard, therefore, it will be apparent that installation of the attenuator pad involves sufficient time to rotate the pad to align the prongs with the corresponding female socket. Moreover, the installation of one such conventional pad requires a space of 7.2 square inches.

In accordance with the present invention, on the other hand, the attenuator pad 16 is miniaturized to a volume about 1/30 the volume of the aforementioned container of a conventional attenuator pad, requiring about 1/15 the space for installation. Moreover, it may be installed in its associated supporting connector 24 in either of two positions of 180° degree rotation, thereby insuring proper installation in a minimum of time.

FIG. 2 illustrates a plurality of attenuator pads 16 of this invention mounted on a conventional elongated electrical connector 24. As a typical illustration, the body of the connector is 7/16 inch wide, ¼ inch thick and of any desired length. Projecting tabs 26 extend longitudinally from the opposite ends of the body and are apertured to receive mounting screws by which the body may be secured to a supporting structure, preferably the main frame of a telephone central office system. The external dimensions of the casing 28 of the attenuator pad 16 is ½ inch wide, ¼ inch thick and ½ inch long.

Referring now primarily to FIG. 3 of the drawing, the attenuator pad of this invention includes a printed circuit board or other form of substrate 30 of electrically non-conductive material. In relation to the foregoing exemplified dimensions of the casing, the substrate is ⅜ inch wide, 1/16 inch thick and ¾ inch long. Thus, when it is inserted into the casing, about ⅛ of an inch of it projects therefrom.

The substrate is provided with a plurality of pairs of spaced electrical conductors 32 and 34 deposited on at least one of its sides. In the preferred embodiment illustrated, and best shown in FIGS. 4 and 5, the conductors are aligned on opposite sides of the substrate. Thus, on the side illustrated in FIG. 4 there are 3 spaced conductors 32. Each extends inwardly from the outer end of the substrate and provides electrical engagement with a corresponding resilient electrical conductor component of the connector 24. The inner ends of the two outer conductors 32 communicate with spaced openings 36 formed through the substrate. The center conductor 32 is connected to an extension 32' which communicates through opening 38 in the substrate with a circular conductor portion 32" surrounding the opening on the opposite side of the substrate (FIG. 5).

On the side of the substrate illustrated in FIG. 5 there is also deposited a plurality of spaced electrical conductors 34 on the outer portion of the substrate. Each conductor is aligned with one of the conductors 32 on the opposite side of the substrate (FIG. 4) and provides electrical engagement with a corresponding resilient electrical conductor component of the connector 24. The inner ends of the two outer conductors 34 are extended to spaced openings 40 formed through the substrate. The center conductor 34 is connected to an extension 34' which communicates through opening 42 in the substrate with a circular conductor portion 34" surrounding the opening on the opposite side of the substrate (FIG. 4).

Electrical resistance means interconnects the ends of the deposited electrical conductors 32 and 34 of each pair. Although the resistance means may be provided by the well known deposition techniques of applying suitably resistive material directly on a substrate, the preferred arrangement illustrated utilizes a conventional resistor element having electric leads projecting from its opposite ends for insertion in the pairs of spaced openings in the substrate and soldering or other form of attachment to the end of the corresponding deposited electrical conductors. As illustrated, there are three pairs of deposited electrical conductors on the substrate and three associated resistors. Two of the resistors are the series resistors 18 and 20 illustrated in FIG. 1, and these are connected in series with the two outer pairs of conductors 32 and 34 on opposite faces of the substrate. The third resistor is the shunt resistor 22 illustrated in FIG. 1, and it is connected in series with the center pair of conductors 32 and 34 on opposite sides of the substrate at the spaced openings 38 and 42.

In the preferred embodiment illustrated, the resistors and supporting portion of the substrate are encased in electrically non-conductive potting material 44, such as epoxy resin, or other suitable electrically non-conductive material. For this purpose it is also preferred that an electrically non-conductive, hollow case 28 to be provided to contain the potting material (FIG. 3). The case is closed at one end by a wall 46, while the opposite end is open to receive the resistor mounting portion of the printed circuit board and the potting material. The lateral sides of the closure wall preferably project from the corresponding side walls of the case to provide finger gripping shoulders 48 by which to facilitate removal of the pad from the connector 24.

FIG. 3 of the drawing also illustrates the construction of a conventional terminal connector 24. The body, also shown in FIG. 2, is of electrically non-conductive material, preferably of molded synthetic resin formed with an internal cavity along its length and confining therein a plurality of longitudinally spaced, opposed pairs of resilient electrical conductors 50 and 52. The resilient portions of the conductors of each pair confined within the body are arranged to receive removably between them the portion of the substrate projecting from the case 28, with each aligned pair of deposited electrical conductors 32 and 34 on said projecting portion of the substrate in electrical engagement with the associated resilient conductors. In this respect, the portions of the deposited electrical conductors on the substrate constitute electrical contacts of the attenuator pad.

It is to be noted that the portion of the substrate 30 projecting from the case 28 is in the form of a flat blade. Thus, by arranging the resistors 18, 20 and 22 in the symmetrical pattern illustrated in FIG. 5, the pad may be installed in the connector 24 in either of its 180° positions of rotation without affecting the circuitry. This materially reduces the time factor involved in installation and replacement of attenuator pads.

The portions of the resilient conductors 50 and 52 extending from the connector body 24 serve as electrical connections for the permanent resistors 10 and input and output terminals 12 and 14 illustrated in FIG. 1. Thus, the connector body may be mounted directly on the main frame of telephone central equipment, thereby eliminating the necessity of equipment bays, the extremely large volume of wires extending to and from them, and the corresponding cost of labor involved conventionally in the continual replacement of such wires.

FIG. 6-9 illustrates an attenuator network assembly embodying the features of this invention. Thus, a base plate 60 of electrically non-conductive material supports a plurality of terminal block strips 62 also of electrically non-conductive material. The strips are arranged in a stack, extending perpendicularly from the base plate, and are provided with laterally spaced, registering openings for the reception of tie rods 64 which also extend through registering openings in the base plate. An exposed, threaded end portion of each rod thus receives a nut 66, by which to secure the stacked blocks and base plate together.

Each terminal block is provided with a plurality of laterally spaced notches 68 (FIG. 6) each arranged to receive an electrically conductive terminal 70. Each terminal is provided intermediate its ends with a notch 72 extending upward from its lower side. The length of the notch is dimensioned to correspond to the width of the terminal block and the depth of the notch is selected to provide the body of the terminal immediately above it with a dimension corresponding to the depth of the notch 68 in the terminal block. Accordingly, when the terminal is positioned within the notch, the upper edge of the terminal lies in the same plane as the upper surface of the block.

The lower surface of each terminal block rests in abutment with the upper surface of the terminal block immediately below it in the stacked assembly. Accordingly, the terminals 70 are secured in position and restrained from displacement.

One end of each electrically conductive terminal is provided with means for the connection of an electrical conductor wire. In the embodiment illustrated, the terminal end portion 74 of each terminal is designed for a solder connection, as is well known.

The opposite end of each terminal is provided with means for the connection of the opposite ends of the wires of the legs formed of the permanent, fixed resistors. In the embodiment illustrated, these ends are designed for a wire wrap, and are herein identified as the input terminals 12 and output terminals 14.

Supported at the upper ends of the stack of blocks 62 by means of the tie rods 64, is a U-shaped support plate 76. The intermediate portion of the plate overlies the stack of blocks, and the spaced end sections 76' project laterally therefrom to support the connector 24. Registering openings in the end sections and the projecting tabs 26 of the connector 24 receive anchor screws 78 for securing the connector 24 in position extending between the end sections, with the electrical conductors 50 and 52 projecting downward alongside the stack of terminal blocks.

The permanent, fixed resistors 10 are soldered or otherwise secured to appropriate one of the conductors 50 and 52. Being of miniature size, they are located conveniently between and adjacent the outer sides of the conductors 50 and 52, as illustrated.

The four fixed resistors 10 are associated with three adjacent pairs of the electrical conductors 50 and 52. The input terminals 12 are connected to the outer terminals 50 through electrical wires 12', and the output terminals 14 are connected to the outer terminals 52 through the flexible wires 14'. The opposite ends 74 of the electric terminals 70 projecting from the opposite side of the stack of terminal blocks thus may be connected to associated telephone line circuitry.

FIGS. 6 and 9 illustrate the assembly of a single attenuator network and the associated attenuator pad 16. It will be understood that a large number of such assemblies may be provided on a single unit. For example, 200 terminals may be arranged on a stacked terminal block assembly measuring about 24 square inches, to provide 50 attenuator network assemblies.

The base plate 60 may conveniently be secured to the main frame of telephone central office equipment. In this manner the conventional equipment bays may be eliminated, together with the multitude of wires leading to and from them.

From the foregoing it will be appreciated that the present invention provides a telephone line attenuator network assembly and pad of economical construction and of such miniaturized size as to reduce significantly the space requirements, wire, maintenance and other substantial cost factors associated with telephone central operations. In this regard, it has been found that the attenuator pad of the dimensions previously mentioned reduces the floor space requirements by a factor of at least about 15, as compared with conventional attenuator pads of the dimensions also mentioned hereinbefore. Further, the attenuator pad of this invention correspondingly reduces the inventory storage space, as will be apparent, and significantly reduces the capital expenditure for such inventory since the cost of the attenuator pads of this invention is significantly lower than those utilized heretofore.

It will be apparent to those skilled in the art that various changes may be made in the size, shape, type, number and arrangement of parts described hereinbefore, without departing from the spirit of this invention.

Having now described our invention and the manner in which it may be used, we claim:

1. A telephone line attenuator network assembly comprising:
   (a) a fixed attenuator section including
      (1) a first set of three equally laterally spaced terminals mounted on a supportive structure and securing among them a first pair of first and second electrical resistors of equal value, one of said resistors being connected between a first outer and the center of said terminals, and the other of said resistors being connected between the center and a second outer of said terminals,
      (2) a second set of three equally laterally spaced terminals mounted on said supportive structure transversely from but aligned uniformly with said first set of terminals and securing among them a second pair of third and fourth electrical resistors each having the same value as the resistors of said first pair, one of said resistors being connected between a first outer and the center of said second set of terminals, and the other of said resistors being connected between the center and a second outer of said second set of terminals,
      (3) said first and second sets of terminals being arranged symmetrically about an axis located centrally therebetween,
      (4) a first pair of flexible conductors respectively electrically coupled to respective ones of said first outer terminals of said first and second sets and respective ones of a first pair of telephone circuitry signal lines,
      (5) a second pair of flexible conductors respectively electrically coupled to respective ones of said second outer terminals of said first and second sets and respective ones of a second pair of telephone circuitry signal lines, and (b) an attenuator pad component removably connected to said fixed attenuator section and including
   (1) a first set of three contacts mounted on a second supportive structure,
   (2) a second set of three contacts mounted on said second supportive structure, said sets of contacts being arranged on said second structure such that, when said attenuator pad component is removably connected to said fixed attenuator section, first, second and third contacts of said first set of contacts are aligned and in contact with said first outer, center and second outer terminals of said first set of terminals, respectively, and first, second and third contacts of said second set of contacts are aligned and in contact with said first outer, center and second outer terminals of said second set of terminals, respectively,
   (3) a fifth electrical resistor connected between said first and third contacts of said first set,
   (4) a sixth electrical resistor of the same value as the fifth resistor connected between said first and third contacts of said second set, and
   (5) a seventh electrical resistor connected between said second contact of said first set and said second contact of said second set, whereby said attenuator pad component may be removably connected to said fixed attenuator section in either of two orientational positions differing by 180°, the first said position being with said first set of contacts aligned and in contact with said first set of terminals and said second set of contacts aligned and in contact with said second set of terminals, and the second said position being with said second set of contacts aligned and in contact with said first set of terminals and said first set of contacts aligned and in contact with said second set of terminals, said attenuator network comprised of said attenuator pad component and said fixed attenuator section providing the same value of attenuation in each said position of said attenuator pad component.

2. The telephone line attenuator network assembly of claim 1 wherein
   (a) said second supportive structure of said attenuator pad component comprises an electrically non-conductive substrate having opposing first and second parallel faces,
   (b) said first and second sets of contacts of said attenuator pad component comprise, respectively, three laterally spaced, elongated, electrical conductors carried on a first face of said substrate and a second set of three laterally spaced, elongated, electrical conductors carried on a second face of said substrate, each said conductor having an outer end contact portion extending to one edge of said substrate, the outer end contact portions of the conductors carried on said first face being aligned with the respective outer end contact portions of the conductors carried on said second face so as to present at said edge an array of three equally spaced opposite pairs of said conductors disposed symmetrically about said edge,
   (c) said fifth electrical resistor is connected between the respective inner ends of the outer conductors carried on the first face of said substrate,
   (d) said sixth electrical resistor is connected between the respective inner ends of the outer conductors carried on the second face of said substrate,
   (e) said seventh electrical resistor is connected between the respective inner ends of the center conductors carried on the first and second faces of said substrate,
   (f) electrically non-conductive potting material surrounds and conceals said fifth, sixth and seventh resistors and corresponding inner portions of the conductors and substrate, and
   (g) an electrically non-conductive case confines said potting material so that said outer end contact portions of the conductors and a supporting portion of said substrate extend outwardly from the case.

* * * * *